(12) United States Patent
Sasatani et al.

(10) Patent No.: US 6,930,449 B2
(45) Date of Patent: Aug. 16, 2005

(54) ELECTROLUMINESCENT DISPLAY DEVICE WITH DESICCANT LAYER

(75) Inventors: Toru Sasatani, Gifu (JP); Tetsuji Omura, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/419,982

(22) Filed: Apr. 22, 2003

(65) Prior Publication Data

US 2004/0012332 A1 Jan. 22, 2004

(30) Foreign Application Priority Data

Apr. 24, 2002 (JP) ........................................ 2002-122114

(51) Int. Cl.[7] .............................................. H05B 33/00
(52) U.S. Cl. ...................................... 313/512; 313/498
(58) Field of Search ................................ 313/498–512; 428/690

(56) References Cited

U.S. PATENT DOCUMENTS

| | | | |
|---|---|---|---|
| 6,226,890 B1 * | 5/2001 | Boroson et al. | 34/472 |
| 6,284,342 B1 * | 9/2001 | Ebisawa et al. | 428/69 |
| 2001/0033946 A1 * | 10/2001 | Mashiko et al. | 428/690 |

* cited by examiner

*Primary Examiner*—Joseph Williams
(74) *Attorney, Agent, or Firm*—Morrison & Foerster LLP

(57) ABSTRACT

In a sealing structure of an electroluminescent display device, in which a first glass substrate formed with an EL element and a second glass substrate as a cap are attached to each other, breaking of the element device is prevented when external force is applied to the first glass substrate and the second glass substrate. The sealing structure has the first glass substrate provided with the EL element on a surface thereof, the second glass substrate attached to the first glass substrate with a sealing resin, a desiccant layer formed on a surface of the second glass substrate and a stress buffer layer covering a surface of the desiccant layer.

5 Claims, 6 Drawing Sheets

ELECTROLUMINESCENT DISPLAY DEVICE WITH DESICCANT LAYER

BACKGROUND OF THE INVENTION

1. Field of the Invention

This invention relates to an electroluminescent display device, particularly to a sealing structure of the electroluminescent display device.

2. Description of the Related Art

In recent years, electroluminescent (hereafter, referred to as an EL) display devices with EL elements have been receiving an attention as a display device substituting a CRT and an LCD.

Since the EL element is sensitive to moisture, there has been known an EL display panel structure in which the EL element is covered with a metal cap or a glass cap coated with a desiccant. FIG. 9 is a cross-sectional view showing such a conventional structure of the EL display panel.

A first glass substrate 70 has a display region formed with many EL elements 71 thereon. The first glass substrate 70 is attached to a second glass substrate 80 working as a cap with sealing resin 75 made of an epoxy resin. The second glass substrate 80 has a concave portion 81 (hereafter, referred to as a pocket portion 81) in a region corresponding to the above display region. The pocket portion 81 is coated with a desiccant layer 82 for absorbing moisture.

Here, the forming of the pocket portion 81 is for securing a space between the desiccant layer 82 and the EL element 71, thereby preventing the EL element 71 from being contacted by the desiccant layer 82, which may result in damaging the EL element 71.

As shown in FIG. 10, however, an external force can be applied to a surface of the first glass substrate 70. This can occur even in a manufacturing process of the EL display device (for example, a process of conveying a glass substrate) and also when a panel surface of the EL display device is touched by a user. This external force causes flexure in the first glass substrate 70, and the desiccant layer 82 and the EL element 71 contact each other. With the application of the further external force, the EL element 71 may be broken by stress from the desiccant layer 82. Furthermore, the same problems are caused by applying of the external force to a surface of the second glass substrate 80.

SUMMARY OF THE INVENTION

The invention provides an electroluminescent display device that includes a first substrate having an electroluminescent element thereon, a second substrate attached to the first substrate, a desiccant layer disposed on the second substrate so that the desiccant layer faces the first substrate, and a stress buffer layer covering the desiccant layer.

The invention also provides an electroluminescent display device that includes a first substrate having an electroluminescent element thereon, a second substrate attached to the first substrate, and a desiccant layer disposed on the second substrate so that the desiccant layer faces the first substrate. The desiccant layer has an elastic coefficient low enough to absorb mechanical stresses generated by the electroluminescent element when it contacts the desiccant layer under an application of an external force to the display device.

DETAILED DESCRIPTION OF THE INVENTION

Figure 1:
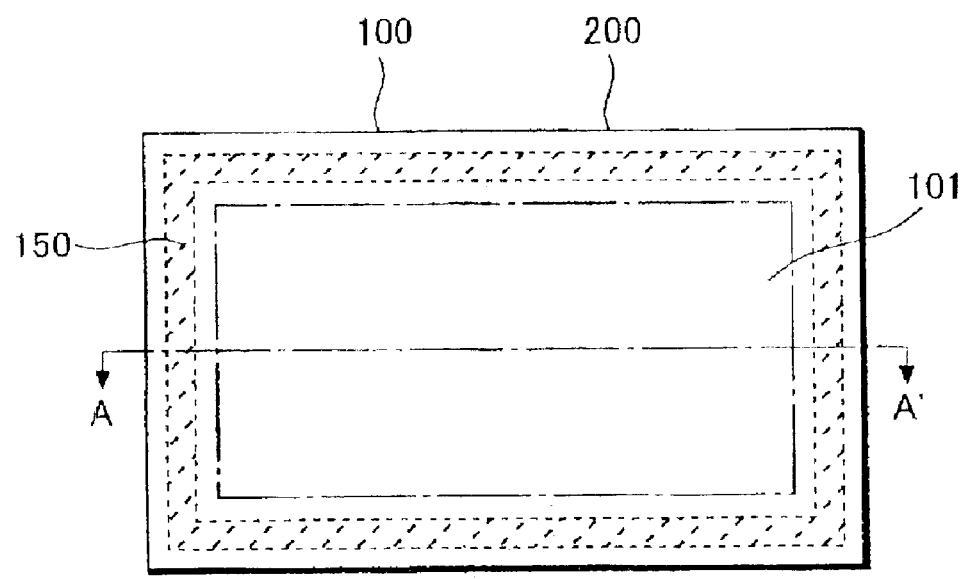
FIG. 1 is a plan view of an electroluminescent display device according to a first embodiment of the invention.
Figure 2:
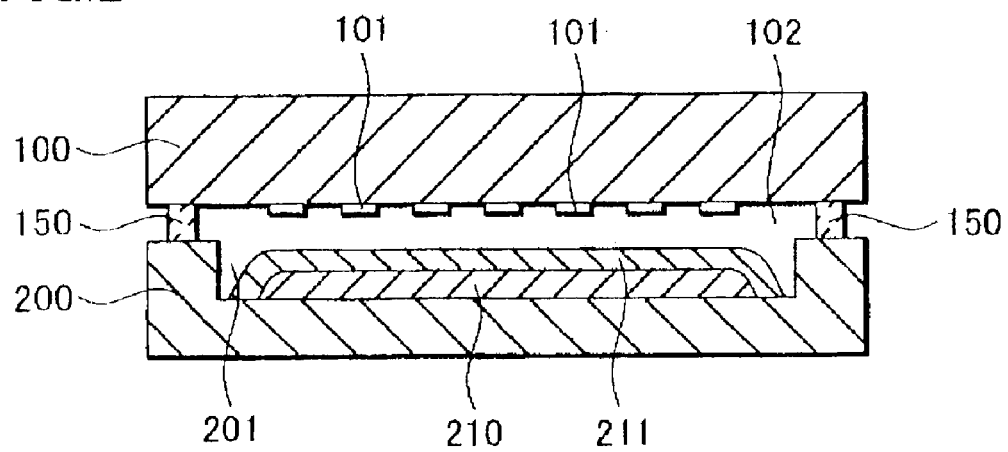
FIG. 2 is a cross-sectional view of the device of FIG. 1 along line A–A' FIG. 1.

FIG. 1 is a plan view of an electroluminescent display device according to a first embodiment of the invention. FIG. 2 is a cross-sectional view along line A–A' of FIG. 1.

A first glass substrate 100 (a display panel) has a display region formed with many EL elements 101 on a surface thereof. The thickness of the first glass substrate 100 is approximately 0.7 mm. In this display region, a plurality of pixels is disposed in a matrix and the EL element 101 is disposed in each of those pixels.

A second glass substrate 200 is a glass substrate for sealing the above mentioned first glass substrate 100 and its thickness is approximately 0.7 mm. This second glass substrate 200 has a concave portion 201 (hereafter, referred to as a pocket portion 201) in a region corresponding to the display region, which is formed by etching. The depth of the pocket portion 201 is approximately 0.3 mm.

There is coated in the pocket portion 201 a desiccant layer 210 for absorbing moisture. The desiccant layer 210 is formed, for example, by coating a solvent dissolved with powdered calcium oxide or barium oxide and resin as an adhesive on a bottom of the pocket portion 201 and then hardening the solvent by UV irradiation or heating.

The desiccant layer 210 is covered with a stress buffer layer 211. The stress buffer layer 211 is formed, for example, by coating the desiccant layer 210 with an epoxy resin or by covering the desiccant layer 210 with a sheet having elasticity made of, for example, polyethylene terephthalate (PET) or fluoroplastic.

Figure 3:
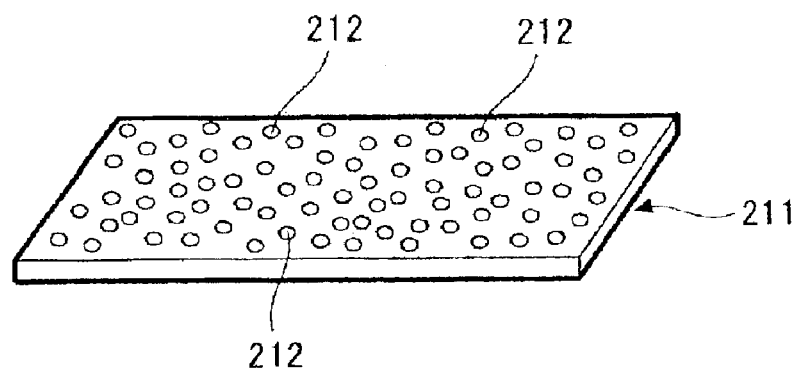
FIG. 3 is a perspective view of a stress buffer layer of the first embodiment of the invention.

Furthermore, the stress buffer layer 211 is preferably has many air vents 212 as shown in FIG. 3. This is for keeping air permeability of the desiccant layer 210 high to prevent it from losing the function as a desiccant.

The first glass substrate 100 and the second glass substrate 200 are attached with sealing resin 150 made of an epoxy resin in a chamber of $N_2$ gas atmosphere. Thus, $N_2$ gas fills a space surrounded by the stress buffer layer 211, the first glass substrate 100 and the sealing resin 150 to form an $N_2$ gas layer 102.

Figure 4:
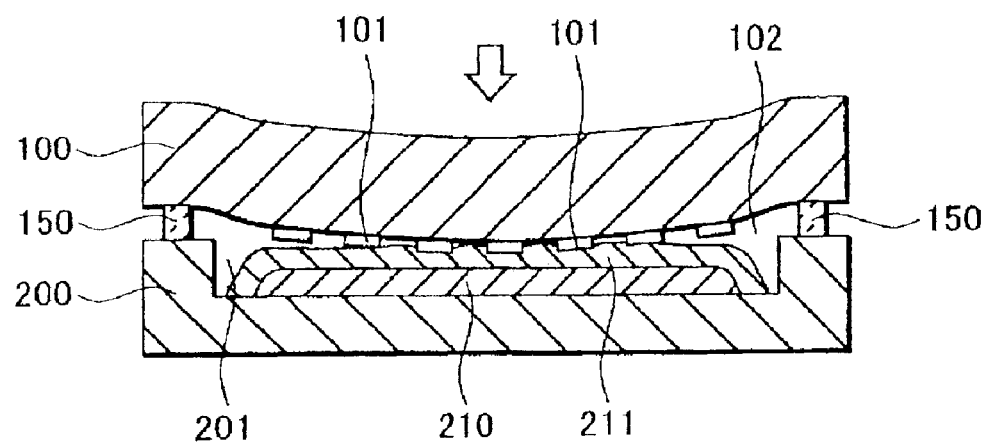
FIG. 4 is a cross-sectional view of the electroluminescent display device of FIG. 1 under application of an external force.

According to this embodiment, the electroluminescent display device has a structure in which the stress buffer layer 211 is disposed between the desiccant layer 210 and the EL element 101. Therefore, as shown in FIG. 4, when an external force is applied to the first glass substrate 100 to cause flexure therein, and the EL element 101 and the stress buffer layer 211 contact each other, elastic deformation occurs in the stress buffer layer 211 so that the stress applied to the EL element 101 is dispersed and absorbed by this stress buffer layer 211, thereby preventing the breaking of the EL element 101.

Second Embodiment

Figure 5:
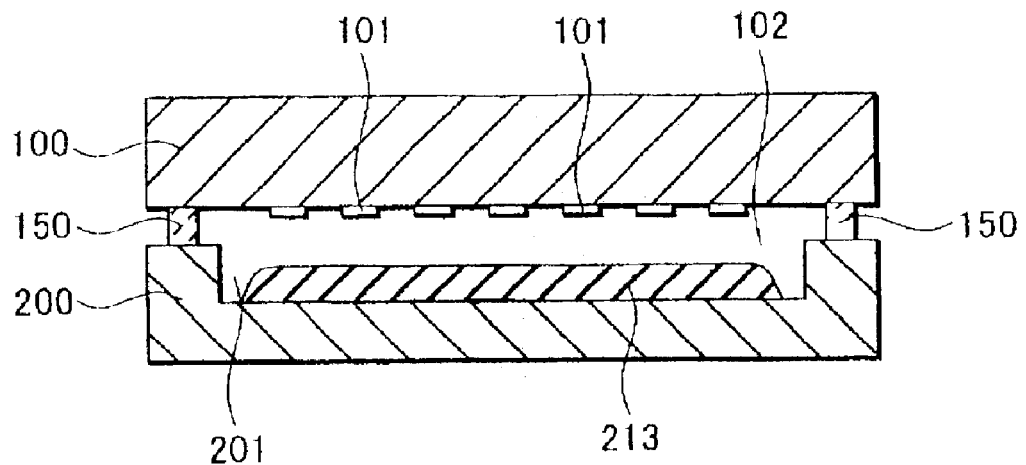
FIG. 5 is a cross-sectional view of an electroluminescent display device according to a second embodiment of the invention.

FIG. 5 is a cross-sectional view showing an electroluminescent display device according to a second embodiment of the invention. FIG. 5 corresponds to a cross-sectional view along line A–A' of FIG. 1. Note that the same numerals are given to the same portions as those of FIG. 2.

While in the first embodiment the desiccant layer 210 is covered with the stress buffer layer 211, in this embodiment the elasticity is provided in the desiccant layer 213 itself, thereby relaxing the stress applied to the EL element 101.

The desiccant layer 213 is formed by coating a solvent dissolved with powdered calcium oxide or barium oxide and a resin as an adhesive on a bottom of the pocket portion 201 and then hardening the solvent by UV irradiation or heating. Here, the amount of the resin in this desiccant layer 213 is increased to 20 or more weight % for increasing the elasticity. Epoxy resin or UV resin is appropriate as the resin.

Figure 6:
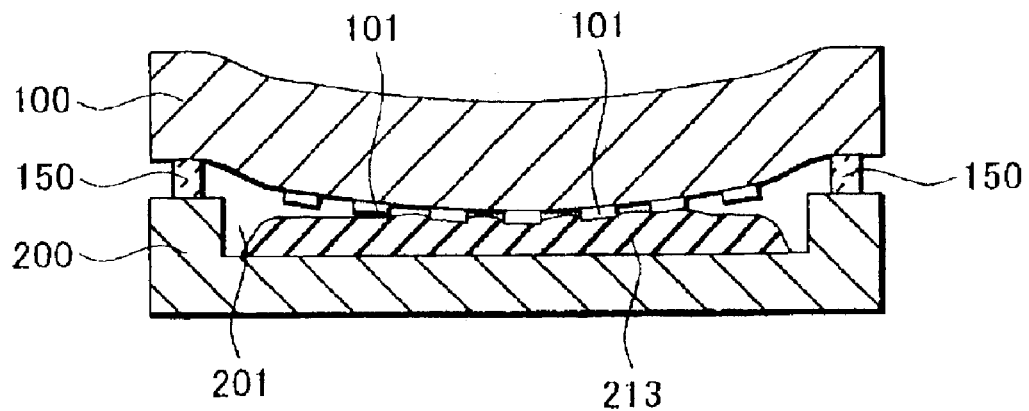
FIG. 6 is a cross-sectional view of the electroluminescent display device of FIG. 5 under application of an external force.

Consequently, as shown in FIG. 6, when an external force is applied to the first glass substrate 100 to cause flexure therein, and the EL element 101 and the desiccant layer 213 contact each other, elastic deformation occurs in the desiccant layer 213 itself so that the stress applied to the EL element 101 is dispersed and absorbed by the desiccant layer 213, thereby preventing the breaking of the EL element 101.

Next, there is described an example of structures of the pixel of the EL display device applied to the first and second embodiments described above.

Figure 7:
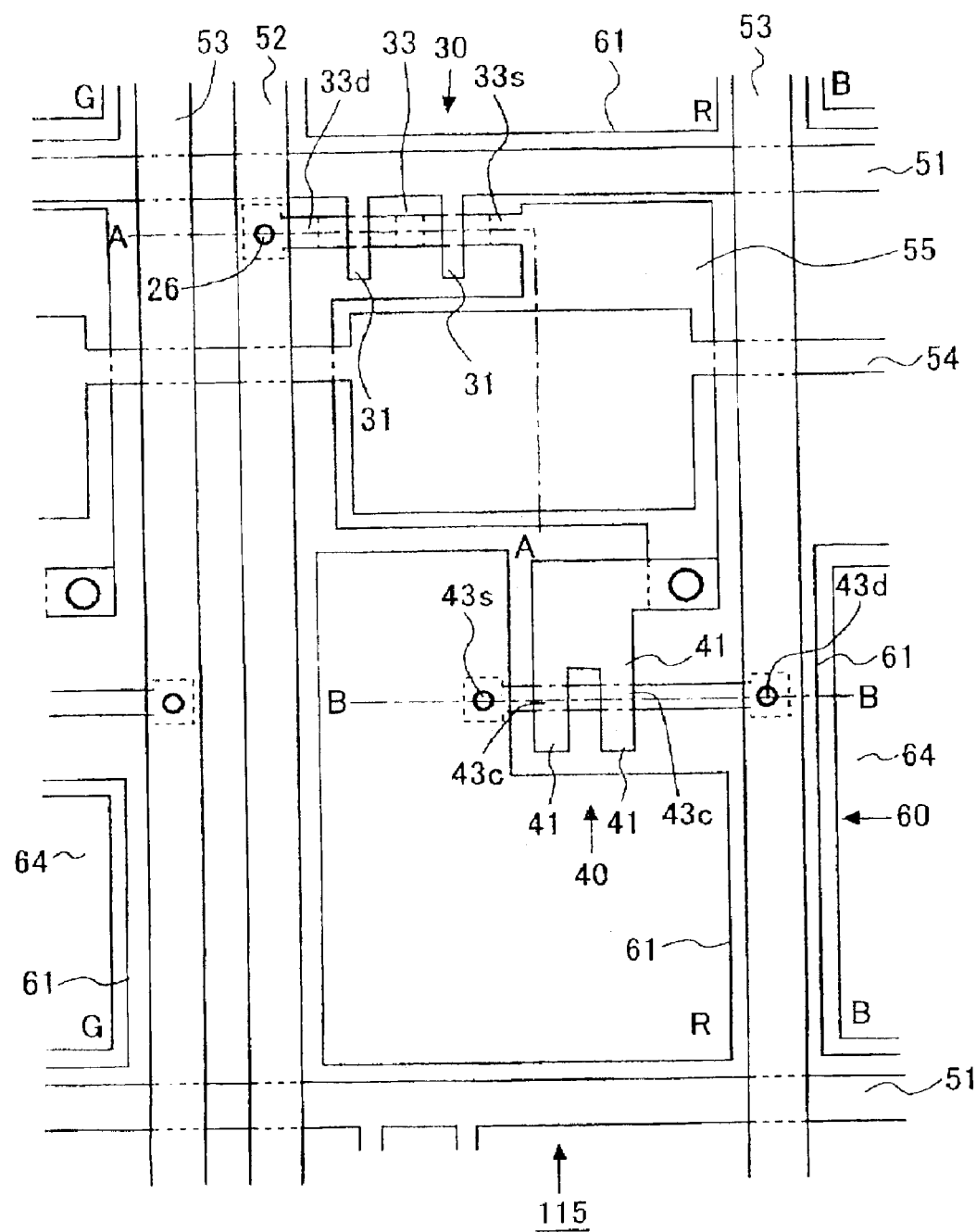
FIG. 7 is a plan view of a pixel of the display devices of the first and second embodiments.
Figure 8A:
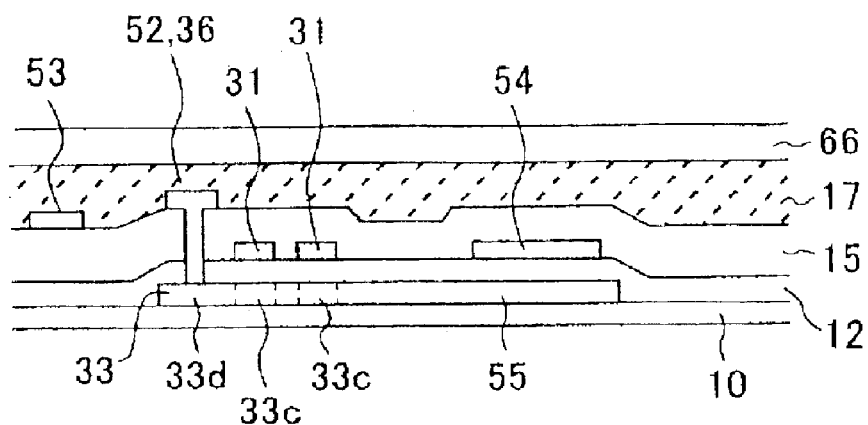
FIGS. 8A and 8B are cross-sectional views of the pixel of the organic EL display device of FIG. 7.
Figure 8B:
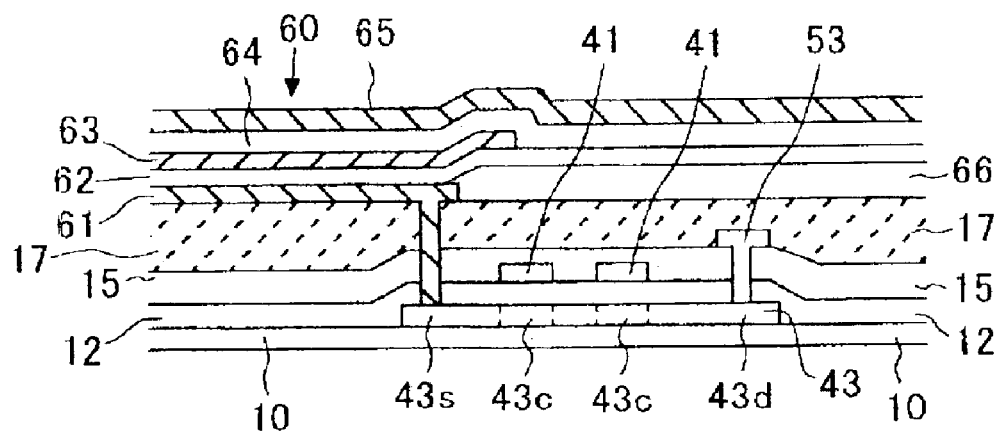
Figure 9:
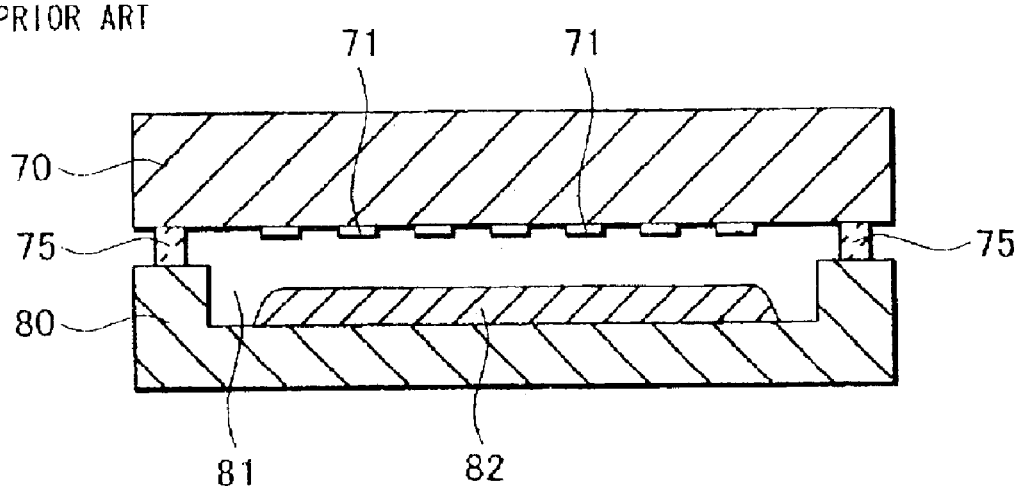
FIG. 9 is a cross-sectional view of a conventional electroluminescent display device.
Figure 10:
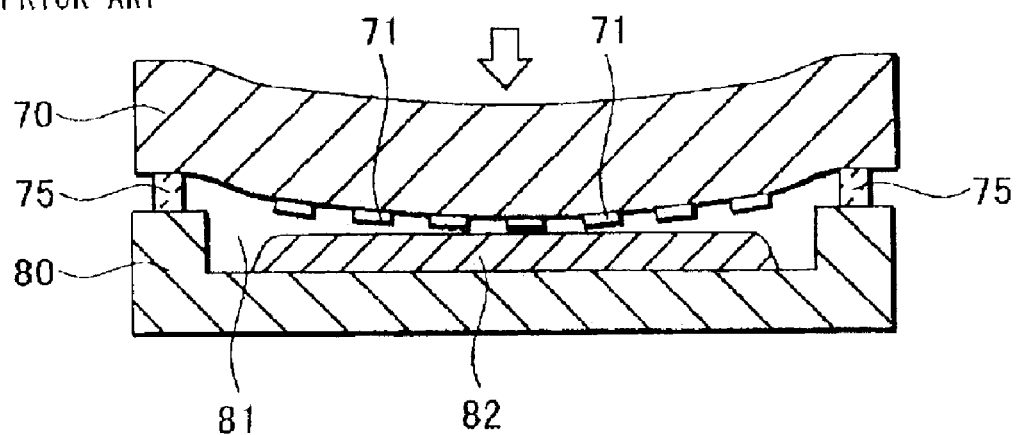
FIG. 10 is a cross-sectional view of the electroluminescent display device of FIG. 9 a cross-sectional view of the electroluminescent display device of FIG. 1 under application of an external force.

FIG. 7 is a plan view showing a pixel of an organic EL display device. FIG. 8A is a cross-sectional view along line A—A of FIG. 7 and FIG. 8B is a cross-sectional view along line B—B of FIG. 7.

As shown in FIG. 7, a pixel 115 is formed in a region enclosed with a gate signal line 51 and a drain signal line 52. A plurality of the pixels 115 is disposed in a matrix.

There are disposed in the pixel 115 an organic EL element 60 as a self-emission device, a switching TFT (thin film transistor) 30 for controlling a timing of supplying an electric current to the organic EL element 60, a driving TFT 40 for supplying an electric current to the organic EL element 60 and a storage capacitor. The organic EL element 60 includes an anode 61, an emissive made of an emission material and a cathode 65.

The switching TFT 30 is provided in a periphery of a point of intersection of the both signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic EL element 60, while a drain 43d is connected to a driving source line 53 as a current source to be supplied to the organic EL element 60.

The storage capacitor electrode line 54 is disposed in parallel with the gate signal line 51. The storage capacitor electrode line 54 is made of Cr (chromium) etc and forms a capacitor by storing an electric charge with the capacitor electrode 55 connected to the source 33s of the TFT through a gate insulating film 12. The storage capacitor 56 is provided for storing voltage applied to the gate electrode 41 of the driving TFT 40.

As shown in FIGS. 8A and 8B, the organic EL display device is formed by laminating the TFTs and the organic EL element sequentially on a substrate 10 such as a substrate made of a glass or a synthetic resin, a conductive substrate, or a semiconductor substrate. When using a conductive substrate or a semiconductor substrate as the substrate 10, however, an insulating film such as $SiO_2$ or $SiN_x$ is formed on the substrate 10, and then the switching TFT 30, the driving TFT 40 and the organic EL element 60 are formed thereon. Each of the two TFTs has a so-called top gate structure in which a gate electrode is disposed above an active layer with a gate insulating film being interposed therebetween.

There will be described the switching TFT 30 first. As shown in FIG. 8A, an amorphous silicon film (hereafter, referred to as an a-Si film) is formed on the insulating substrate 10 made of a silica glass or a non-alkali glass by a CVD method. The a-Si film is irradiated by laser beams for melting and recrystalizing to form a poly-silicon film (hereafter, referred to as a p-Si film) as an active layer 33. On the active layer 33, a single-layer or a multi-layer of an $SiO_2$ film and an $SiN_x$ film is formed as the gate insulating film 12. There are disposed on the gate insulating film 12 the gate signal line 51 made of metal having a high melting point such as Cr or Mo (molybdenum) and also serving as a gate electrode 31, the drain signal line 52 made of Al (aluminum), and the driving source line 53 made of Al and serving as a driving source of the organic EL element.

An interlayer insulating film 15 laminated with an $SiO_2$ film, an $SiN_x$ film and an $SiO_2$ film sequentially is formed on the whole surfaces of the gate insulating film 12 and the active layer 33. There is provided a drain electrode 36 by filling metal such as Al in a contact hole provided correspondingly to a drain 33d. Furthermore, a planarization insulation film 17 for planarizing a surface which is made of organic resin is formed on the whole surface.

Next, there will be described the driving TFT 40 of the organic EL element. As shown in FIG. 8B, an active layer 43 formed by poly-crystalizing an a-Si film by irradiating laser beams thereto, the gate insulating film 12, and the gate electrode 41 made of metal having a high melting point such as Cr or Mo are formed sequentially on the insulating substrate 10. There are provided in the active layer 43 a channel 43c, and a source 43s and a drain 43d on both sides of the channel 43c. The interlayer insulating film 15 is formed on the whole surfaces of the gate insulating film 12 and the active layer 43. There is disposed the driving source line 53 connected to a driving source by filling metal such as Al in a contact hole provided correspondingly to a drain 43d. Furthermore, a planarization insulation film 17 for planarizing the surface, which is made of, for example, an organic resin is formed on the whole surface. A contact hole is formed in a position corresponding to a source 43s in the planarization insulation film 17. There is formed on the planarization insulation film 17 a transparent electrode made of ITO (Indium Tin Oxide) and contacting to the source 43s through the contact hole, i.e., the anode 61 of the organic EL element. The anode 61 is formed in each of the pixels, being isolated as an island.

The organic EL element 60 has a structure of laminating sequentially the anode 61 made of a transparent electrode such as ITO, a hole transport layer 62 including a first hole transport layer made of MTDATA (4,4-bis(3-methylphenylphenylamino)biphenyl) and a second hole transport layer made of TPD (4,4,4-tris(3-methylphenylphenylamino) triphenylanine), an emissive 63 made of Bebq$_2$ (bis(10-hydroxybenzo[h]quinolinato) beryllium) containing a quinacridone derivative, an electron transport layer 64 made of Bebq$_2$, and a cathode 65 made of magnesium-indium alloy, aluminum or aluminum alloy.

Incidentally, the planarization insulation film 17 is formed with a second planarization insulation film 66 thereon. The second planarization insulation film 66 is removed on the anode 61.

In the organic EL element 60, a hole injected from the anode 61 and an electron injected from the cathode 65 are recombined in the emissive and an exciton is formed by exciting an organic module forming the emissive 63. Light is emitted from the emissive 63 in a process of radiation of the exciton and then released outside after going through the transparent anode 61 to the transparent insulating substrate 10, thereby to complete light-emission.

According to this embodiment, in the sealing structure of the electroluminescent display device in which the first glass substrate (a display panel) having the EL element and the second glass substrate for sealing the EL element are attached together, the stress buffer layer is disposed between the desiccant layer and the EL element, thereby preventing the breaking of the EL element 101 when external force is applied to the first glass substrate or the second glass substrate. Furthermore, the amount of the resin in the desiccant layer is increased so that the same effect is obtained without using the stress buffer layer.

What is claimed is:

1. An electroluminescent display device comprising:
   a first substrate having an electroluminescent element thereon;
   a second substrate attached to the first substrate;
   a desiccant layer coated on the second substrate so that the desiccant layer faces the first substrate; and
   a stress buffer layer covering the desiccant layer so that a peripheral portion of the stress buffer layer is attached directly to the second substrate.

2. The electroluminescent display device of claim 1, wherein the stress buffer layer is made of a resin.

3. The electroluminescent display device of claim 1, wherein the stress buffer layer includes a plurality of air vents.

4. The electroluminescent display device of claim 2, wherein the stress buffer layer includes a plurality of air vents.

5. The electroluminescent display device of claim 1, wherein the second substrate includes a concave portion and the desiccant layer is disposed in the concave portion.

* * * * *